United States Patent [19]
Matsuzaki

[11] Patent Number: 5,604,383
[45] Date of Patent: Feb. 18, 1997

[54] STABILIZED POWER SUPPLY DEVICE USING A FLIP CHIP AS AN ACTIVE COMPONENT

[75] Inventor: Kazuo Matsuzaki, Nagano, Japan

[73] Assignee: Fuji Electric Co., Ltd., Kawasaki, Japan

[21] Appl. No.: 439,579

[22] Filed: May 11, 1995

[30] Foreign Application Priority Data

May 11, 1994 [JP] Japan ................................ 6-097088

[51] Int. Cl.$^6$ .......................... H01L 23/48; H01L 29/40; H01L 23/28; H05K 7/20
[52] U.S. Cl. .......................... 257/778; 257/691; 257/737; 257/738; 257/904; 361/702; 361/729; 363/147
[58] Field of Search .................... 257/688, 691, 257/697, 698, 712, 728, 734, 737, 738, 778, 904; 361/702, 729; 363/147

[56] References Cited

U.S. PATENT DOCUMENTS 5,355,301   10/1994   Satio et al. .................... 363/147

FOREIGN PATENT DOCUMENTS 60-136363   7/1985   Japan .
2177406    7/1990   Japan .
2262308   10/1990   Japan .

*Primary Examiner*—Carl Whitehead, Jr.
*Attorney, Agent, or Firm*—Morrison Law Firm

[57] ABSTRACT

A stabilized power supply device includes a substrate and a passive part laminate layered on the substrate. The passive part laminate, shaped as a single flat board, includes a thin charge storage film element. A thin magnetic inductive film element is laminated on the thin charge storage film element. The device also includes an active part incorporated in a flip chip. The flip chip, including semiconductors and bump electrodes, is mounted on an upper surface of the passive part laminate. The upper surface of the passive part laminate includes terminals for connecting the passive part laminate to the bump electrodes. This connection also fixes the active part to the passive part laminate.

6 Claims, 12 Drawing Sheets

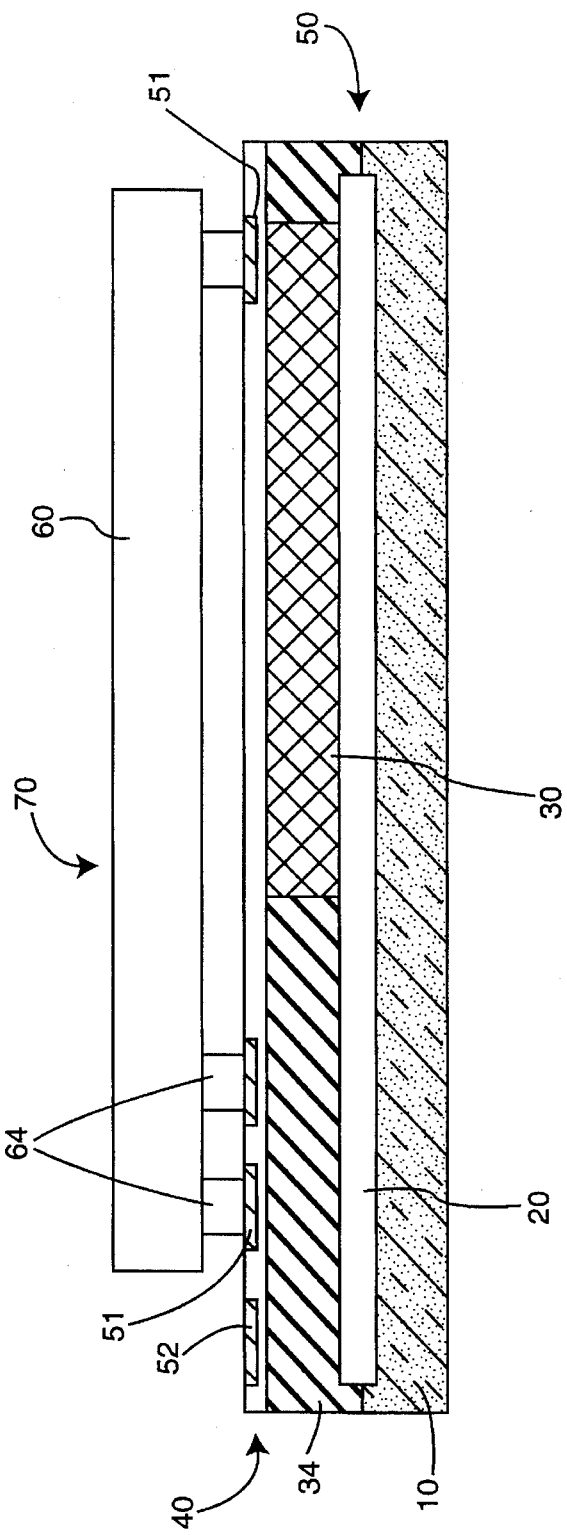

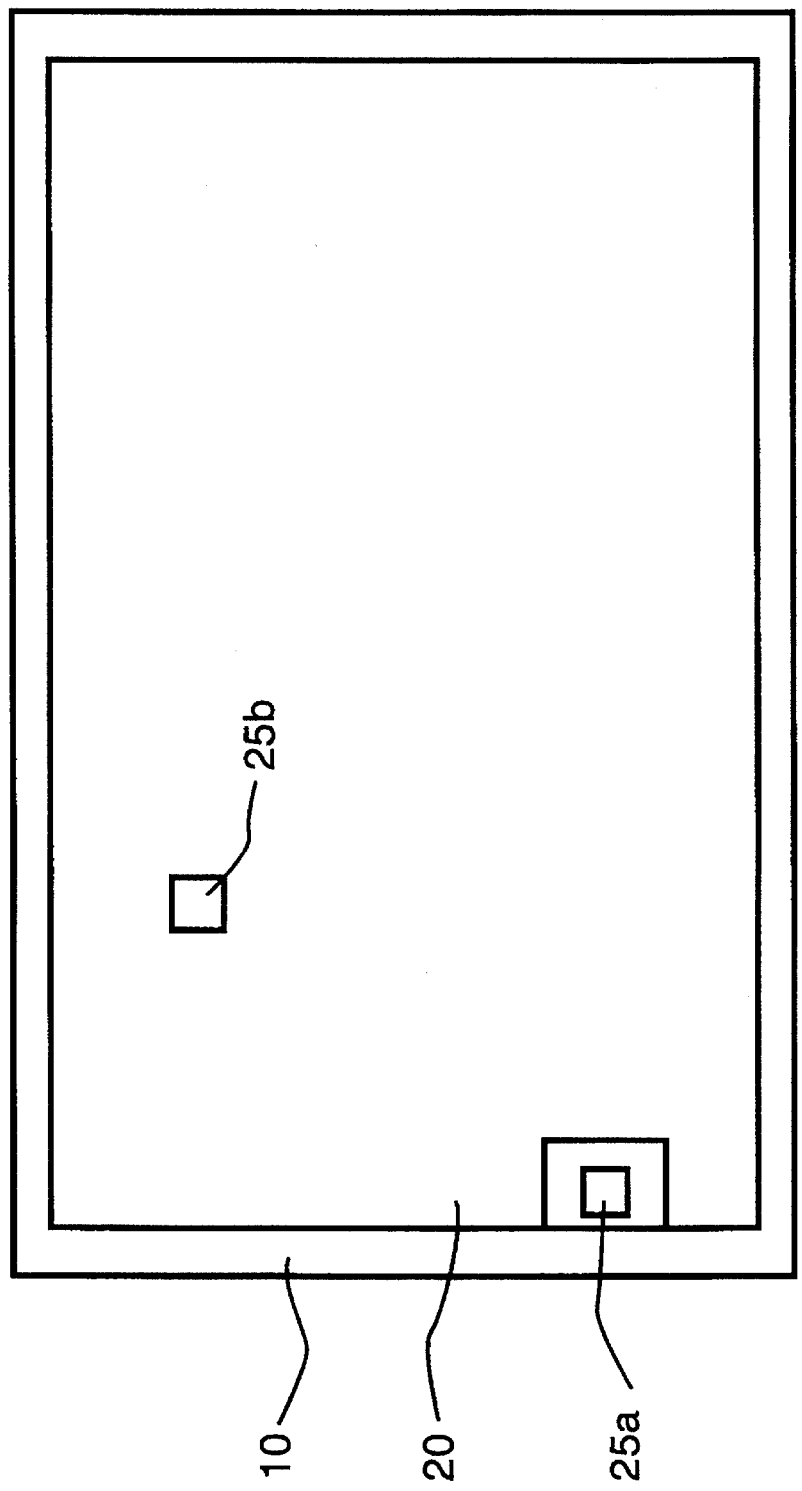

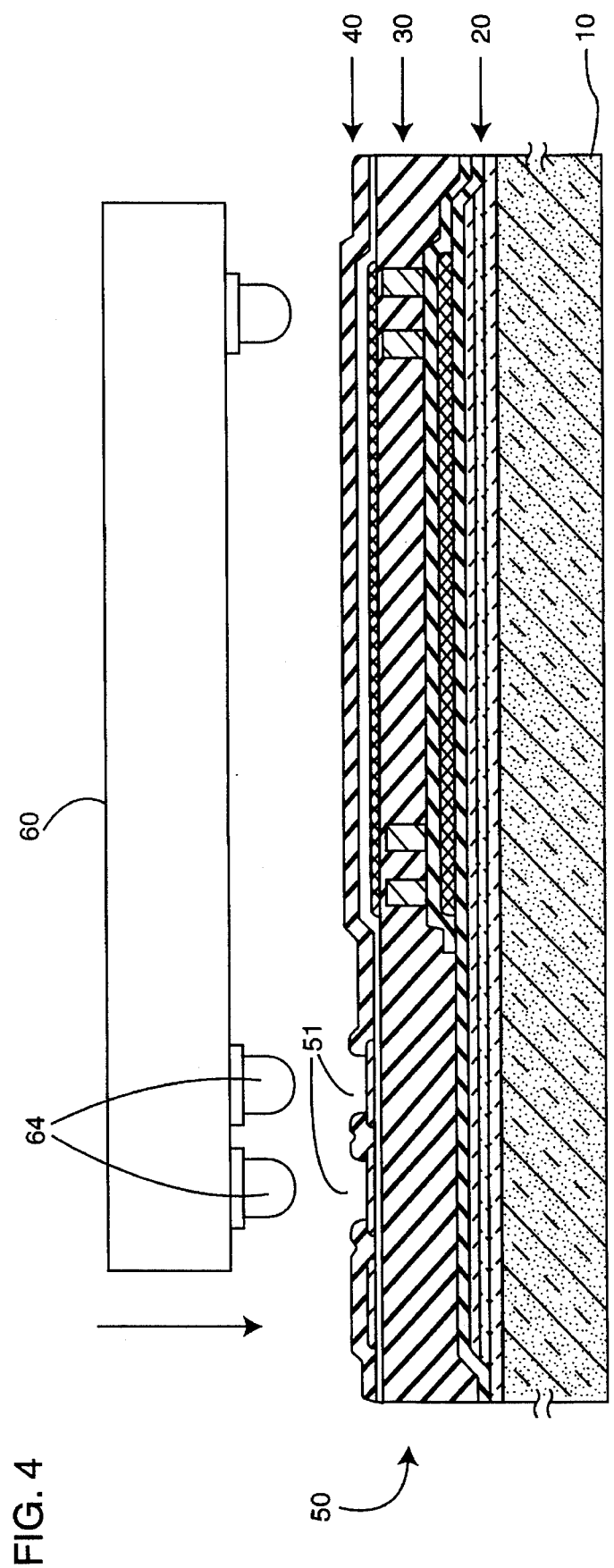

STABILIZED POWER SUPPLY DEVICE USING A FLIP CHIP AS AN ACTIVE COMPONENT

BACKGROUND OF THE INVENTION

The present invention is directed to a miniaturized stabilized power supply device, such as a switching power supply, and a method for manufacturing such a device. A passive part, including a charge storage film element and a magnetic inductive film element, is formed into a passive part laminate in the shape of a flat board. An active part, formed into a flip chip including semiconductor elements such as transistors and diodes, is mounted on an upper surface of the passive part laminate.

Stabilized power supply devices are known. Conventional stabilized power supply devices are generally constructed by mounting semiconductor elements, such as transistors and diodes, charge storage film elements, such as resistors and capacitors, and magnetic inductive film elements, such as reactances and transformers, on a resin printed circuit board.

A hybrid integrated circuit is generally used for devices of comparatively small capacity but large quantity, in which a ceramic printed circuit board is used instead of the resin printed circuit board. In addition, semiconductors and integrated circuits are mounted on the ceramic printed circuit board as bare chips. Also included are a charge storage film element and a magnetic inductive film element which are generally surface mounted on the hybrid integrated circuit.

However, in attempts to downsize (miniaturize) conventional power supply devices, the passive part laminate, in particular the magnetic inductive film element, is usually disposed behind the active part by utilizing semiconductor technology.

Japanese Laid Open Patent Application No. S60-136363, No. H02-262308, and No. H02-177406 contain a brief review of the prior art attempts at miniaturizing conventional power supply devices by forming coils and magnetic circuits containing thin film structures. Marginally successful attempts at producing miniaturized elements such as transformers and methods for forming coil type inductors on substrates similar to those for integrated circuits are disclosed in Japanese Open Patent Application No. S60-136363. However, the attempts at substantially downsizing conventional power supply devices have been unsuccessful.

Similarly, Japanese Laid Open Patent Publication No. 2-177406 presents attempts at downsizing conventional power supply devices by including the use of a thin film inductance element exhibiting a high inductance value. According to this publication, the film inductance element is equipped with a winding conductor part, formed flatly on a conductor substrate, a signal output conductor part, a signal output conductor part, an insulator that insulates the signal input conductor, and a superconductor film laminate. The insulating film, arranged between a plurality of superconductor films, is provided at the center of the winding conductor, and the semiconductor films have independent windings for current applications.

By way of an example, the reference discloses a superconductor film laminate equipped with two layers of thin superconductor films that is insulated by an insulating film of MgO containing $YBa_2Cu_2Ox$. No attempts are made at downsizing conventional power supply devices similar to the present invention.

Similarly, Japanese laid Open Patent Application No. 2-262308 is directed at a plane indicator, in which a large inductance is achieved simultaneously with a small load current. According to this publication, a necessary inductance can be obtained, with a large load current, by means of a high permeability magnetic substance with a large magnetic flux saturation density on both sides of spiral type coil insulating layers.

The miniaturization of passive part laminates of conventional stabilized power supply devices, including magnetic inductive film elements and charge storage film elements, has been attempted by using the aforementioned thin film structure.

In recent years, an increase in the demand for substantially cheap and small electronic devices has in turn created a demand for miniaturized electronic components together with a reduction in the overall cost of conventional stabilized power supply devices. Indeed, the demand for smaller devices at low cost has been growing steadily. This demand in turn has created a demand for effective stabilized power supply devices which can be adopted for use in smaller electronic devices.

However, the demand for smaller stabilized power supply devices effective for use in miniaturized electronic devices has not been met. Attempts at adapting existing components for use in miniaturized electronic devices have been unsuccessful and have resulted in the surface-mounting of active parts of semiconductor devices and the passive parts of discrete elements on the hybrid integrated circuit.

However, surface mounting requires an extensive area for mounting conventional semiconductor chips and elements. This method also uses the area underneath the mounted chips for wiring the various components. The surface mounting method leaves a lot to be desired in that it fails to effectively utilize the space provided. Indeed, the surface mounting method requires substantial space, which defeats the whole purpose of miniaturizing conventional electronic components.

OBJECTS AND SUMMARY OF THE INVENTION

Accordingly, an object of the present invention is to overcome the limitations and drawbacks of the prior art.

It is an object of the invention is to provide a miniaturized stabilized power supply device which is smaller than conventional stabilized power supply devices.

This object is achieved by utilizing the area of the semiconductor chips in the active part and that of the elements in the passive part.

Briefly stated, a stabilized power supply device includes a substrate and a passive part laminate layered on the substrate. The passive part laminate, shaped as a single flat board, includes a thin charge storage film element. A thin magnetic inductive film element is laminated on the thin charge storage film element. The device also includes an active part incorporated in a flip chip. The flip chip, including semiconductors and bump electrodes, is mounted on an upper surface of the passive part laminate. The upper surface of the passive part laminate includes terminals for connecting the passive part laminate to the bump electrodes. This connection also fixes the active part to the passive part laminate.

According to an embodiment of the invention, a stabilized power supply device includes a substrate, a passive part laminate layered on the substrate and having a single flat board shape, the passive part laminate including a thin charge storage film element, a thin magnetic inductive film element laminated on the thin charge storage film element, an active part incorporated in a flip chip including semiconductors and bump electrodes, a plurality of terminals disposed on an upper surface of the passive part laminate for connecting the passive part laminate to the bump electrodes, and the plurality of terminals being effective for affixing the active part to the passive part laminate.

According to an embodiment of the invention, a method of manufacturing a passive part laminate for a stabilized power supply device includes forming a charge storage film element on a substrate by layering a dielectric film between lower and upper electrode films, layering a first insulating layer on the upper electrode film, forming a first plurality of terminals for connecting the charge storage film element, forming a magnetic inductive film element on the charge storage film element, forming a coil in the magnetic inductive film element, forming a second insulating layer in the magnetic inductive film element, forming a second plurality of terminals for connecting the magnetic inductive film element, and layering a protective film on the magnetic inductive film element.

According to an embodiment of the invention, a method of manufacturing a stabilized power supply device includes forming a passive part laminate of the device by combining a charge storage film element and a magnetic inductive film element, connecting a plurality of bump electrodes of a flip chip of an active part of the device to the passive part laminate, and affixing the flip chip to the passive part laminate.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1a is a side cross sectional view of an active part of a stabilized power supply device according to an embodiment of the present invention.

FIG. 1b is a circuit diagram of the stabilized power supply device of the embodiment FIG. 1a.

FIG. 1c is a plan view of the stabilized power supply device of the embodiment of FIG. 1a.

FIG. 2a is plan view of an intermediate wherein a charge storage film element is mounted on a substrate.

FIG. 2b is a plan view of an intermediate in which a magnetic inductive film element is mounted on the charge storage film element of FIG. 2a.

FIG. 4 is a side sectional view taken along the line IV—IV of FIG. 2d of the active part and a sectional view of the passive part laminate in the stage of connecting both.

FIG. 5b is a plan view of the stabilized power supply device according to the embodiment of FIG. 5a.

DETAILED DESCRIPTION OF THE PREFERRED EMBODIMENT

Figure 1B:
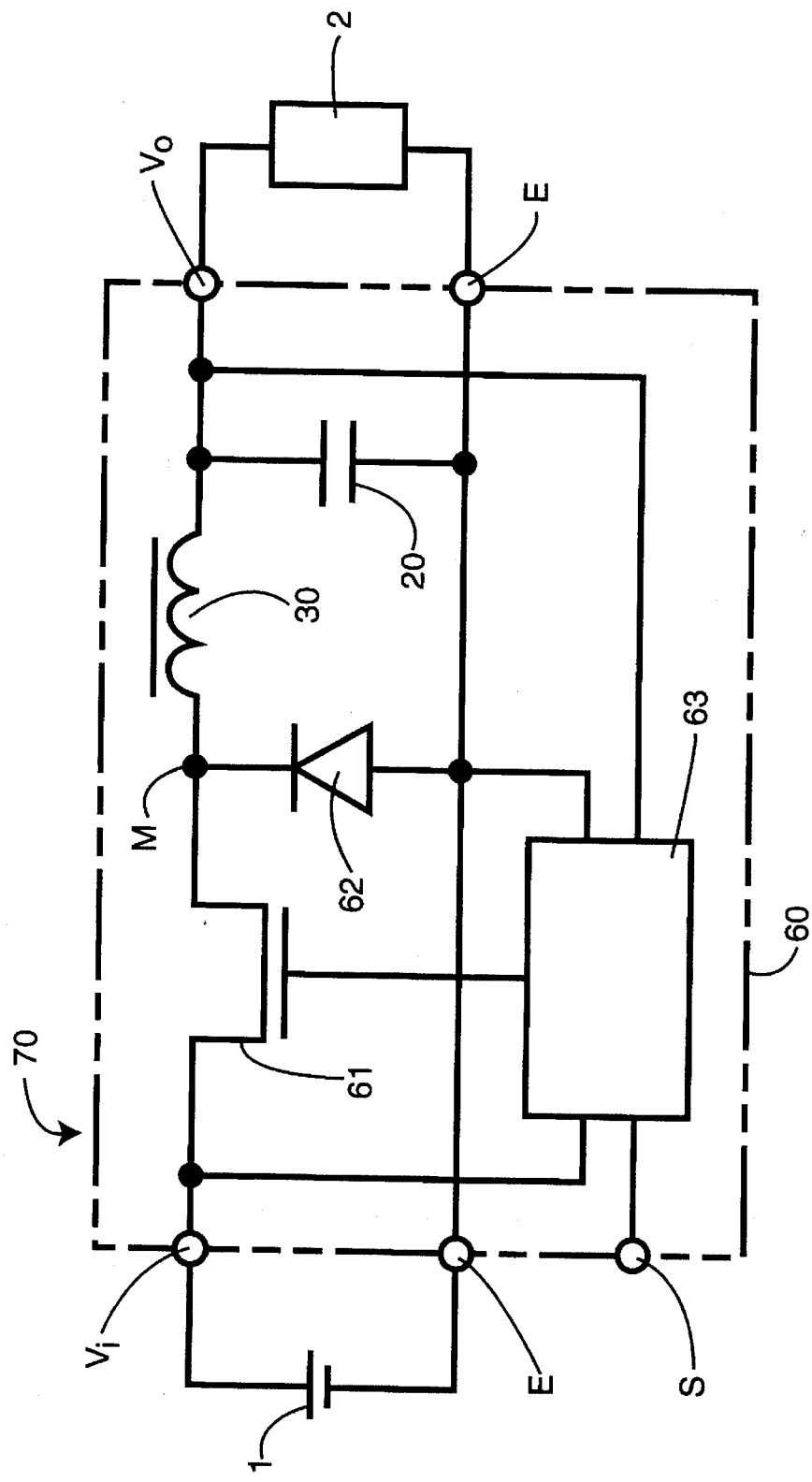

The object of the present invention is achieved by a stabilized power supply device which includes a substrate, a passive part laminate formed on the substrate, and an active part integrated in a flip chip that includes semiconductors and has bump electrodes or protruded electrodes. The stabilized power supply device of the present invention also includes terminals disposed on an upper surface of the layered body for connecting to the bump electrodes and for fixing the active part to the passive part.

The passive part includes a single flat board shape. It further includes a thin charge storage film element. The passive part also includes a thin magnetic inductive film element overlapping the charge storage film element.

It is preferable to use a semiconductor substrate as the substrate. A metal substrate may be used as the substrate, but the semiconductor substrate is preferable because of its ability to utilize semiconductor technology.

It is also preferable to use a ferroelectric film such as lead zirconite titanate and similar components, with dielectric constants of at least 1000 or more, as dielectric films of the charge storage film element to minimize size and maximize capacitance.

It is preferable that the magnetic inductive film element have a shell type structure having a coil formed from a conductor film sandwiched between upper and lower magnetic films. Moreover, it is preferable to overlap the magnetic inductive film element on the charge storage film element.

Similarly, it is desirable to dispose a wiring layer, including a wiring film other than the conductor of the coil for the magnetic inductive film element, on the upper surface of the passive part laminate, and to form the terminals of the passive part laminate from the wiring film.

For purposes of this invention, it is understood that the magnetic inductive film element may overlap the charge storage film element, but the upper and lower arrangements may be reversed.

An alternative embodiment of the invention contemplates a method for manufacturing the stabilized power supply device including a passive part laminate and an active part incorporated in a flip chip and mounted on the passive part laminate.

The novel method includes the steps of layering electrode films and a dielectric film for a charge storage film element on a substrate, layering magnetic films for a magnetic inductive film element on the charge storage film element, and growing a conductor film by electroplating through a pattern of a coil and terminals for connecting to the connecting parts of the charge storage film element.

Thereafter, a wiring layer is disposed on the magnetic inductive film element, followed by forming terminals from a wiring film of the wiring layer, connecting bump electrodes of the flip chip of the active part to terminals on the upper surface of the passive part laminate, and finally, fixing the flip chip to the passive part laminate.

It is preferable to flatten the upper surface of the passive part laminate. After electroplating the conductor film of the magnetic inductive film element, the upper surface can be made flat and even by coating the surface with an insulator in a liquid state. The liquid insulator is then solidified by heating. It is also preferable to use insulators composed of materials which include the silanol group. It is more preferable to use an insulator composed of polyamide resin.

It is preferable to use solder as metal for the bump electrode. Likewise, it is desirable to mount the flip chip on the active part at a temperature below 300° C. for facilitating the mounting process. At such temperatures, problems associated with high temperatures are minimized.

As described earlier, a stabilized power supply device of the present invention is miniaturized as an integrated body by the following measures.

Essentially, a passive part is formed into a small size by incorporating the charge storage film element with the magnetic inductive film element of the passive part into a passive part laminate. The size is further made compact by the use of fine patterning techniques commonly known in the semiconductor art.

The total area of the passive part is substantially reduced since both of the elements overlap. This is achieved by forming the charge storage film element and the magnetic inductive film into a passive part laminate, of a single flat board shape, by semiconductor processes.

The bump electrodes of a flip chip, in which semiconductor elements are integrated, are connected only to terminals disposed on the upper surface of the passive part laminate without surface mounting each passive element. An active part is then fixed or integrated with the passive part.

A method of manufacturing a stabilized power supply device of the present invention is an especially preferable practical technique for forming a passive part laminate. After layering electrode films and a dielectric film on a substrate sequentially and forming a charge storage film element, a magnetic film of a magnetic inductive film element is layered on the upper side of the charge storage film element. Then a conductor film for a coil and connecting parts of the charge storage film element are grown by the electroplating method through fine patterns. Therefore, the magnetic inductive film element is miniaturized and its coil has a sufficient current capacity.

Furthermore, a wiring layer is disposed on the magnetic inductive film element, and terminals are formed from the wiring film of the wiring layer on the upper side of the magnetic inductive film element, thereby completing the passive part laminate.

Referring to FIG. 1a, a stabilized power supply device 70 includes a passive part laminate 50 in a lower portion of device 70 together with an active part 60 formed in an upper portion of device 70. Substrate 10 of passive part laminate 50 is formed preferably of a semiconductor substrate, although a metal substrate can be used, on an upper side of which a charge storage film element 20 of a capacitor and a magnetic inductive film element 30 of a reactance or a transformer overlap. Thus substrate 10, charge storage film element 20 and magnetic inductive film element 30 of passive part laminate 50 are integrated and formed into a single flat board shape.

Furthermore, since magnetic inductive film element 30 is smaller than charge storage film element 20, a levelling process is applied on a level difference. Thus an upper surface of the layered body of the passive part laminate 50 is made flat in this embodiment. Moreover, in this embodiment, a wiring layer 40 is disposed on the upper surface of the layered body. Charge storage film element 20 and magnetic inductive film element 30 are connected to each other. Connection pads, such as terminals 51 and 52, are formed from a wiring film 41 of wiring layer 40.

Terminals 51 connect passive part laminate 50 to active part 60. Terminals 52 connect passive part laminate 50 to an outside source (not shown). It is possible to omit wiring layer 40 and alternatively use a conductor film as a coil of magnetic inductive film element 30.

Figure 1C:
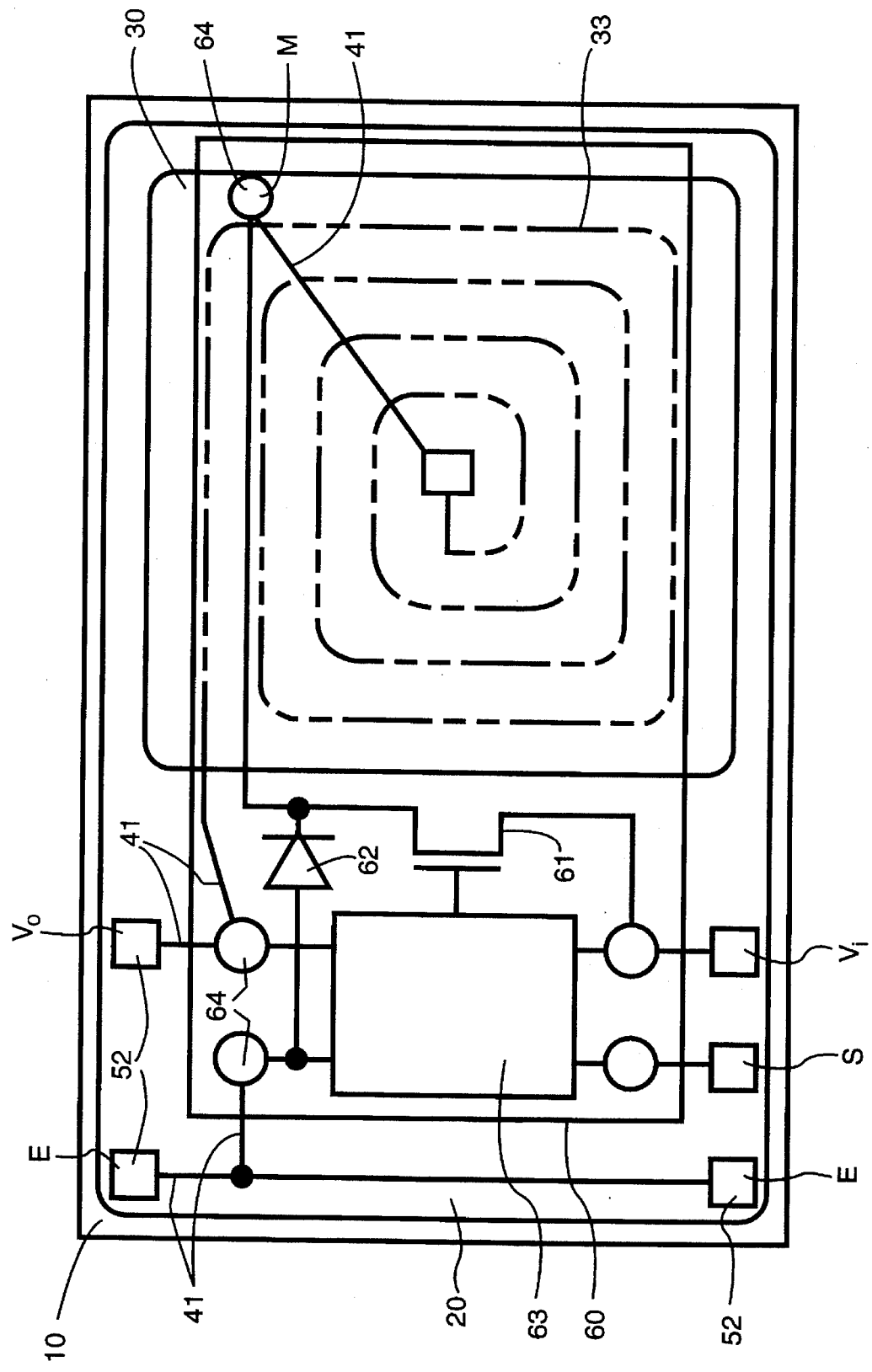

Referring to FIGS. 1b–1c, another embodiment of the present invention is shown. Active part 60 includes a transistor 61 and a diode 62 formed in a flip chip and connected through a plurality of bump electrodes 64 to passive part laminate 50. It is especially preferable to construct this flip chip as an integrated circuit in which all semiconductor elements comprising active part 60 are built in. It is also preferable to use solder for the metal of the bump electrodes, i.e., protruded electrodes.

The connection of active part 60 to passive part laminate 50 is performed by soldering or jointing the bump electrodes to terminals 51 on the upper surface of the layered body. At the same time, active part 60 is fixed and integrated with passive part laminate 50.

Referring to FIG. 1b, a circuit diagram of stabilized power supply device 70 is shown. Stabilized power supply device 70 of the embodiment is a switching power supply device of a type known as a step-down. The step-down device receives an input voltage $V_i$ from a DC power supply 1 and supplies a constant and stabilized DC output voltage $V_o$ lower than $V_i$ to a load 2. As is well known, the device switches a current, flowing through the magnetic inductive film element 30 of a reactance from power supply 1 to the load 2 by a transistor 61. When transistor 61 is switched off, output voltage $V_o$ is stabilized by charge storage film element 20, a capacitor, keeping a current supply through commutating diode 62. In this embodiment, a control circuit 63, powered from the input voltage $V_i$, receives the output voltage $V_o$ and controls a duty ratio of ON/OFF of transistor 61 to keep output voltage $V_o$ constant. A start/stop command to stabilized power supply 70 is given to control circuit 63.

Stabilized power supply device 70 of the present invention, in one example, receives input voltage $V_i$ of 12 V and supplies output voltage $V_o$ of 5 V and a current of 0.5 A to 1 A to load 2, with output capacity of 2.5 W to 5 W. In this device, the switching frequency is set at 1 MHZ or more to miniaturize the device as small as possible, and the capacitance of charge storage film element 20 is made several µF, with the inductance of magnetic inductive film element 30 as small as 0.5 µH to 1 µH. In this embodiment, charge storage film element 20 and magnetic inductive film element 30 are partially overlapped and formed into passive part laminate 50. Active part 60 of a flip chip integrated with the semiconductor elements and semiconductor circuits (as shown in FIG. 1b as the left half portion within the encircled area by a broken line) is mounted on passive part laminate 50.

FIG. 1c shows a plan view of the outlined structure of stabilized power supply device 70 in a completed state. In this embodiment, charge storage film element 20 is mounted on nearly all of the surface of rectangular substrate 10. A nearly square magnetic inductive film element 30, which has a coil conductor film 33 arranged in a spiral, as shown with chain lines, is mounted in the right portion. Furthermore, a rectangular flip chip of active part 60 is mounted on an upper side of magnetic inductive film element 30. Transistor 61, diode 62, and control circuit 63, integrated in the flip chip, are shown together in the left portion for convenience of illustration, and connected through bump electrodes 64 to terminals 51 in FIG. 1a.

In the example, terminals 52 for outside connection are connection pads disposed at upper and lower left sides and formed using a wiring film 41 of wiring layer 40 at its end. The connection stages with wiring film 41 are shown by thin lines in FIG. 1c. Outside connection terminals 52 are assigned with marks corresponding to the circuit diagram in FIG. 1b.

To facilitate understanding of the plan view in FIG. 1c, sequential steps are shown in FIGS. 2a–2d with plan views at each stage.

FIG. 2a shows a stage of mounting charge storage film element 20 on substrate 10 and leading out two terminals 25a and 25b.

Figure 2B:
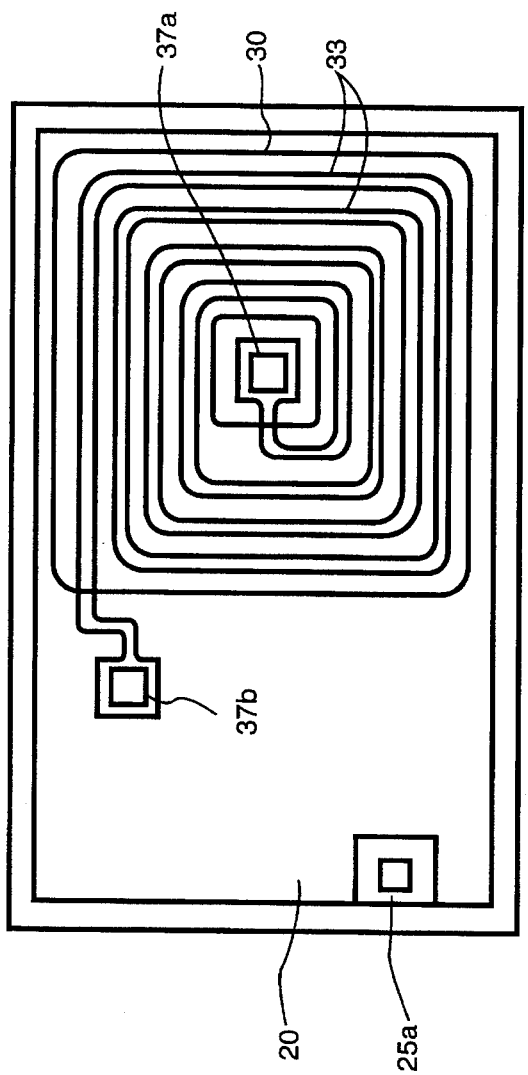

FIG. 2b shows a stage of mounting the magnetic inductive film element 30 on charge storage film element 20 and disposing two terminals 37a and 37b at both ends of coil conductor film 33 for a coil of magnetic inductive film element 30. Terminal 37b is connected to terminal 25b of charge storage film element 20.

Figure 2C:
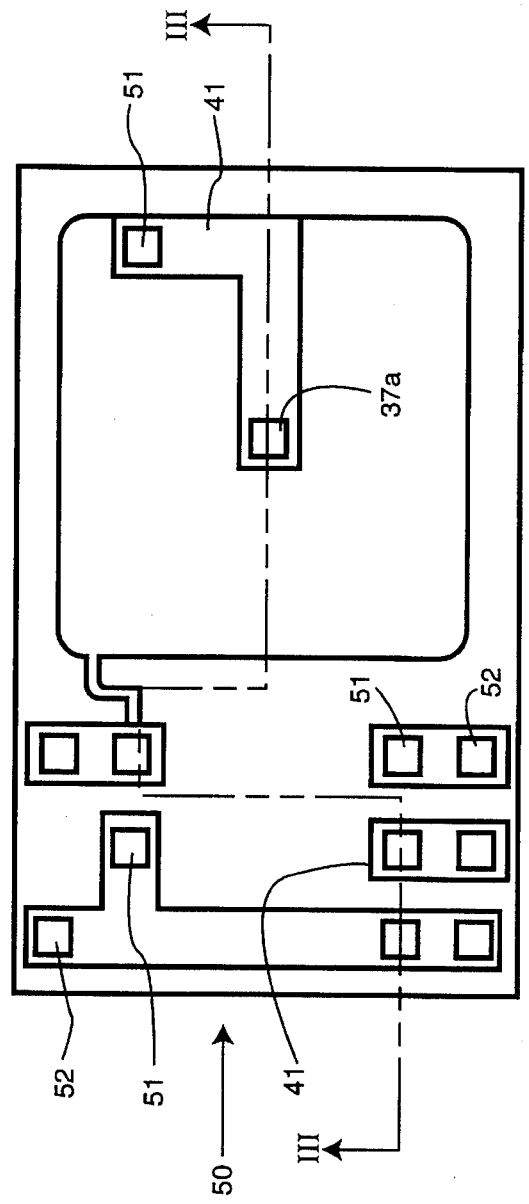
FIG. 2c is a plan view of a completed passive part laminate with a disposed wiring layer.

FIG. 2c shows a stage of forming wiring film 41 of wiring layer 40. As shown in this figure, connection pads are formed as terminals 51 for connecting wiring film 41 to bump electrodes 64 and outside connection terminals 52 as shown in FIG. 1a. Terminal 37a of magnetic inductive film element 30 is connected to terminal 51 by this process. Furthermore, terminal 25a of charge storage film element 20 is connected through wiring film 41 to grounding terminal 52.

Figure 2D:
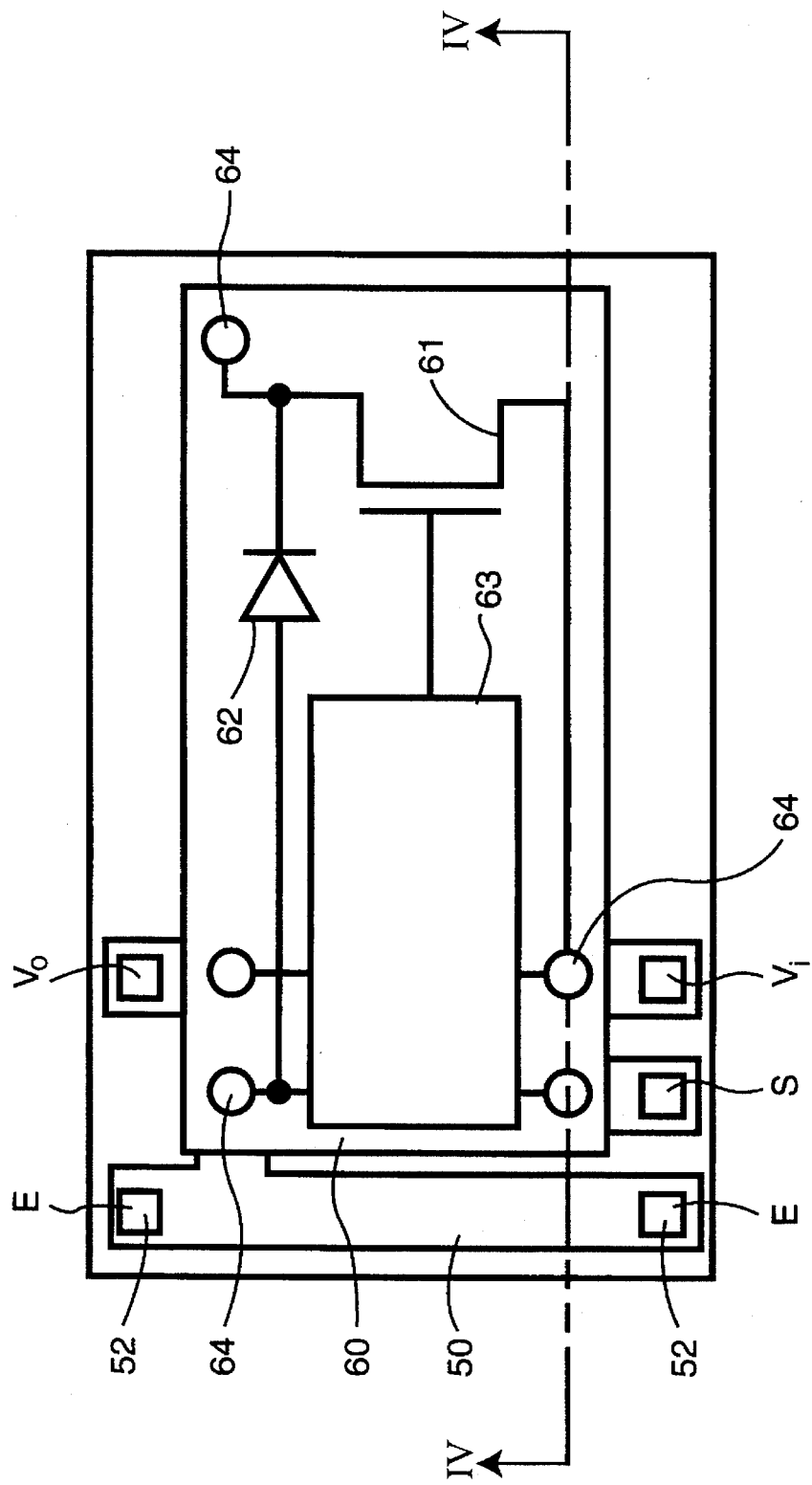
FIG. 2d is a plan view of a completed stabilized power supply device in which an active part is connected and fixed with the passive part laminate of FIG. 2c.

FIG. 2d shows a stage of mounting active part 60 on passive part laminate 50. This is a completed stage after bump electrodes 64 of active part 60 are connected to terminals 51 in FIG. 2c.

Referring to FIGS. 3a–3f, a method for manufacturing stabilized power supply device 70 around passive part laminate 50 is set forth. FIGS. 3a to 3f show the sectional views of passive part laminate 50 taken along line III—III in FIG. 2c.

Figure 3A:
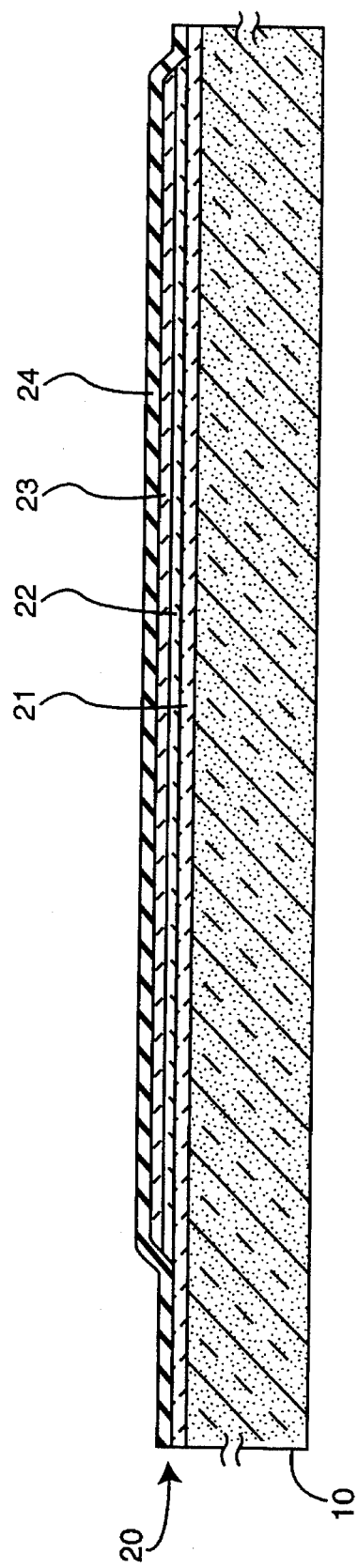
FIG. 3a is a sectional view taken along line III—III of FIG. 2c of an intermediate wherein a charge storage film element is built on an upper surface of a substrate.

Referring to FIG. 3a, charge storage film element 20 is built on substrate 10. Substrate 10 in this embodiment is a semiconductor substrate of n-type semiconductor with a resistivity of 0.01 Ωcm. A lower electrode film 21 of charge storage film element 20, made of Pt or Au, is layered to a thickness of approximately 1 μm on the entire upper surface of the substrate 10 by vapor deposition. Further, a dielectric film 22 of lead zirconite titanate is layered to a thickness of 1 μm by sputtering, and an upper electrode film 23 is layered in the same manner as the electrode film 21. It is preferable to use a ferroelectric with a high dielectric constant of 1000 to several thousand, e.g., lead zirconite titanate, as dielectric film 22. It is also preferable to layer the thin film thickness on the whole surface of the substrate 10 for making the capacitance of charge storage film element 20 as large as possible to stabilize the output voltage $V_o$.

Next, for forming dielectric film 22 and upper electrode film 23 into a pattern shown in FIG. 2a, after the Pt or Au of the electrode film 23 is wet-etched with aqua regia using a mask of photo-resist film, lead zirconite titanate of dielectric film 22 is plasma-etched in an atmosphere including, e.g., $CF_4$ gas, using the same mask. Further, an insulating film 24 is layered with silicon oxide to a thickness of approximately 1 μm, covering the whole surface by sputtering or CVD. Hence, charge storage film element 20 becomes a completed stage as shown in FIG. 3a.

Figure 3B:
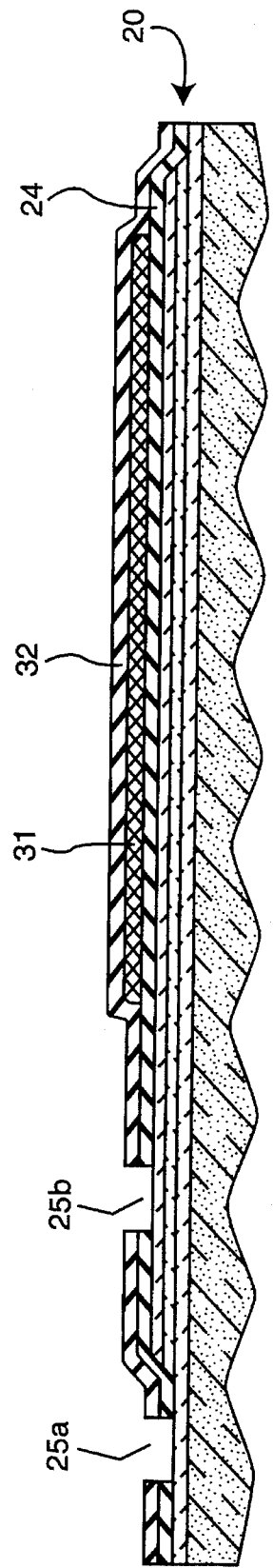
FIG. 3b is a sectional view taken along line III—III of FIG. 2c of an intermediate wherein a lower magnetic film of the magnetic inductive film element is layered.

FIGS. 3b to 3e show the steps of fabricating magnetic inductive film element 30. Referring to FIG. 3b, a lower magnetic film 31 with high permeability is layered with, e.g., CoHfTa, to a thickness of about 3 μm by sputtering on the entire upper surface of charge storage film element 20, wet-etched with aqua regia by using a mask of photo-resist film, and in this embodiment, formed into a square pattern as shown in FIG. 2b.

The magnetic film made of CoHfTa, described above as a high initial relative permeability of 3000 to 4000, is suitable for use in magnetic fields of frequency higher than 1 MHZ, but when increased inductance and reduced high frequency loss are desired, it is preferable to form magnetic film 31 into a pattern with fine slits. An insulating film 32 is layered with an insulator such as, e.g., silicon oxide, to a thickness of about 1 μm on the whole surface in the same manner as the preceding step, and insulating film 32 and aforementioned insulating film 24 are plasma-etched by using a mask of photo-resist film. Then, terminals 25a and 25b of charge storage film element 20 are disposed through the etched windows.

Figure 3C:
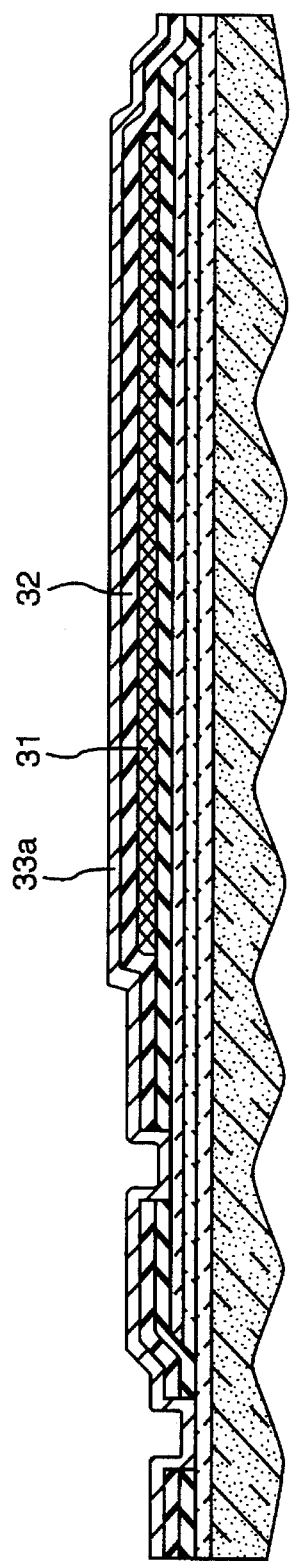
FIG. 3c is a sectional view taken along line III—III of FIG. 2c of an intermediate wherein an electroplating electrode film for electroplating a conductor film of the magnetic inductive film element is layered.
Figure 3D:
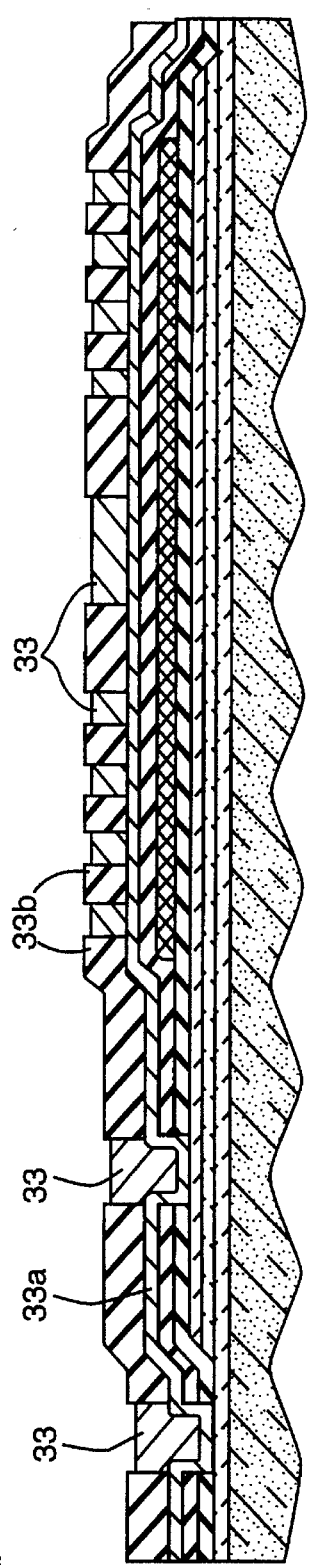
FIG. 3d is a sectional view taken along line III—III of FIG. 2c of an intermediate a wherein a conductor film for a coil of the magnetic inductive film element is electroplated.

Referring to FIG. 3c, a preparatory step of growing conductor film 33 for a coil of magnetic inductive film element 30 by an electroplating method in FIG. 3d is shown. A plating electrode film 33a is attached with, e.g., Ti to a thickness of approximately 0.5 μm on the entire surface by sputtering.

Referring to FIG. 3d, a step of electroplating of conductor film 33 is shown. After a photoresist film 33b of, e.g., P-AR900 type made by PMER Co., is first attached with a desired pattern. For example, Cu is selectively grown to a thickness of 20 μm on the bared plating electrode film at openings of photoresist film 33b by the electroplating method with a plating solution of copper sulfate group made by EEJA Co. In this case, conductor film 33 is grown with a spiral coil pattern shown in the right portion in FIG. 2b, and with a small window pattern on terminals 25a and 25b as shown in the left portion of FIG. 2a.

Conductor film 33 of the coil is shown with a section of oblate shape in the figure for convenience of illustration, but in practice, it has a width of 100 μm or more corresponding to a current capacity of the coil and is grown with a section of greater width than that shown in the figure. After conductor film 33 is selectively grown in the desired position, plating electrode film 33a is unnecessary. Therefore, after photoresist film 33b is removed with a conventional remover liquid and plating electrode film 33a is exposed to outside, its Ti is removed with, e.g., dilute hydrochloric acid using conductor film 33 as a mask for etching.

Figure 3E:
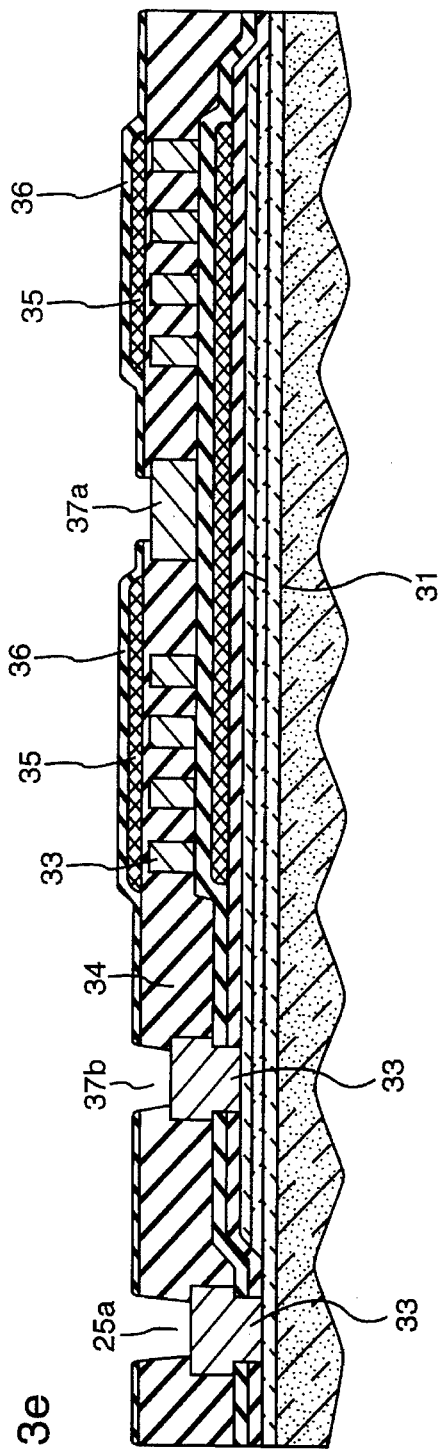
FIG. 3e is a sectional view taken along line III—III of FIG. 2c of an intermediate wherein a upper magnetic film of the magnetic inductive film element is layered.

Referring to FIG. 3e, a completed stage of the magnetic inductive film element 30 with an upper magnetic film 35 is shown. Then, a flattening treatment is performed in which an insulator 34 in a liquid state is spin-coated followed by solidification by heating. Material having silanol groups or a polyamide resin is suitable for insulator 34. The surface can be nearly perfectly flattened by spin-coating either in a state of high viscosity, multiple times if necessary, and solidifying or hardening at a temperature of 400° to 500° C. Since a thickness of insulator 34 must be at least that of conductor film 33, it is preferable to overlap polyamide resin on the material of silanol group.

Growing and patterning of upper magnetic film 35 may be the same as that of lower magnetic film 31, but since magnetic inductive film element 30 is of a spiral form in this embodiment, upper magnetic film 35 is formed into a ring shape with a center window as shown in FIG. 2b. Further, after an insulating film 36 is layered with, e.g., silicon oxide, to a thickness of approximately 1 μm in the same manner as above, this film and insulator 34 are photo-etched. Then, conductor film 33 is partially exposed to outside for terminals 37a and 37b of magnetic inductive film element 30 and terminal 25a, as shown in the figure.

In this process, insulating film 36 is etched in the same manner as above, but when etching insulator 34, plasma-etching is preferably adopted using a $C_2F_6$ gas for the silanol group and a mixed gas of $CF_4$ and $O_2$ for the polyamide resin. Moreover, magnetic inductive film element 30 in this embodiment is a shell type which has a coil of conductor film 33 sandwiched between magnetic films 31 and 35. Therefore, it has merits of high inductance and requires only a one-time flattening, compared with a core type in which a magnetic film is sandwiched between coils.

Figure 3F:
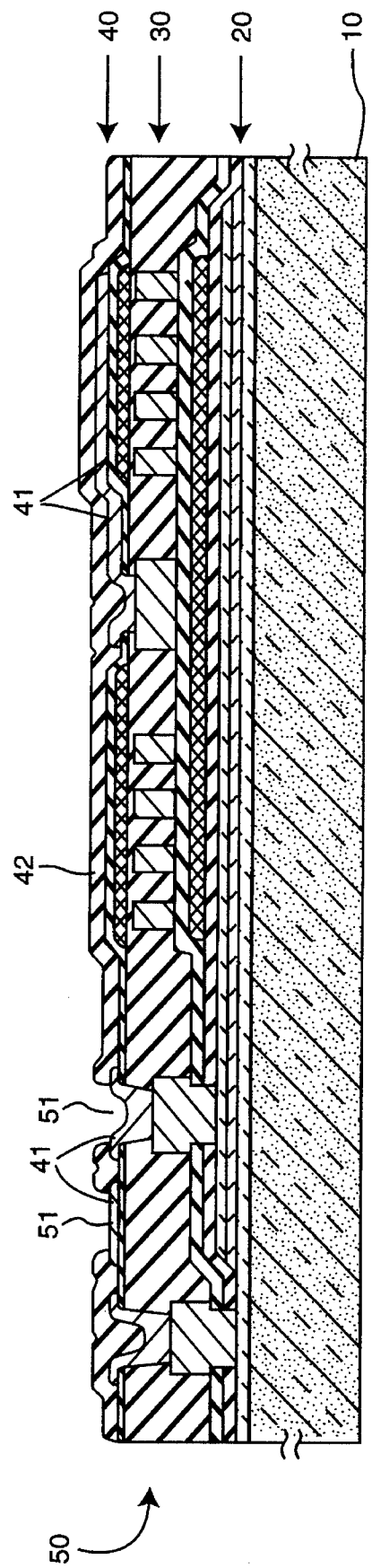
FIG. 3f is a sectional view taken along line III—III of FIG. 2c of an intermediate showing a completed passive part laminate with the disposed wiring layer.

Referring to FIG. 3f, bump electrodes 64 of active part 60 of FIG. 1a can be connected to terminals 25a, 37a and 37b as shown in the stage in FIG. 3e. However, it is preferable to dispose wiring layer 40 on a surface of insulating film 36. Wiring film 41 of wiring layer 40 is layered with, e.g., Cu of 1 μm overlapped on an underlayer of Ti of 0.1 μm, and photo-etched with ammonium peroxide sulfate into a pattern as shown in FIG. 2c. The Ti is removed with dilute hydrofluoric acid. In addition, a protection film 42 is layered with silicon nitride, for example, to a thickness of 1 μm by the CVD method, and plasma-etched with a $CF_4$ gas for opening windows. Then, a layered body of passive part laminate 50 with connection pads as terminals 51, on an upper surface becomes the completed stage as shown in the figure.

FIG. 4 shows a stage of connecting bump electrodes 64 of active part 60 to terminals 51 on the upper surface of passive part laminate 50, but both are somewhat separated. Passive part laminate 50 is shown as a sectional view along IV—IV line in FIG. 2d, and active part 60 is shown as a side view of the flip chip. In the present invention, it is preferable to use solder electrodes as bump electrodes 64 to minimize the temperature needed for making connections. These solder bump electrodes 64 have round tips from the so-called reflow processing technique.

Hence, bump electrodes 64 can be easily soldered to terminals 51 by lightly depressing the flip chip of active part 60 on passive part laminate 50 which is preheated at a temperature of 200° to 300° C. along the direction of the in FIG. 4. Of course, passive part laminate 50, and especially flattening insulator 34, is not deteriorated at these temperatures. Simultaneously with the connection, active part 60 is fixed to passive part laminate 50 and integrated stabilized power supply device 70 is completed. Stabilized power supply device 70 is an assembly of a flat board shape with a small size and a thickness of about 2 mm, since passive part laminate 50 is a rectangle of 10 to 20 mm in its side length, and the flip chip of active part 60 is a rectangle of less than 10 mm in its side length.

Figure 5A:
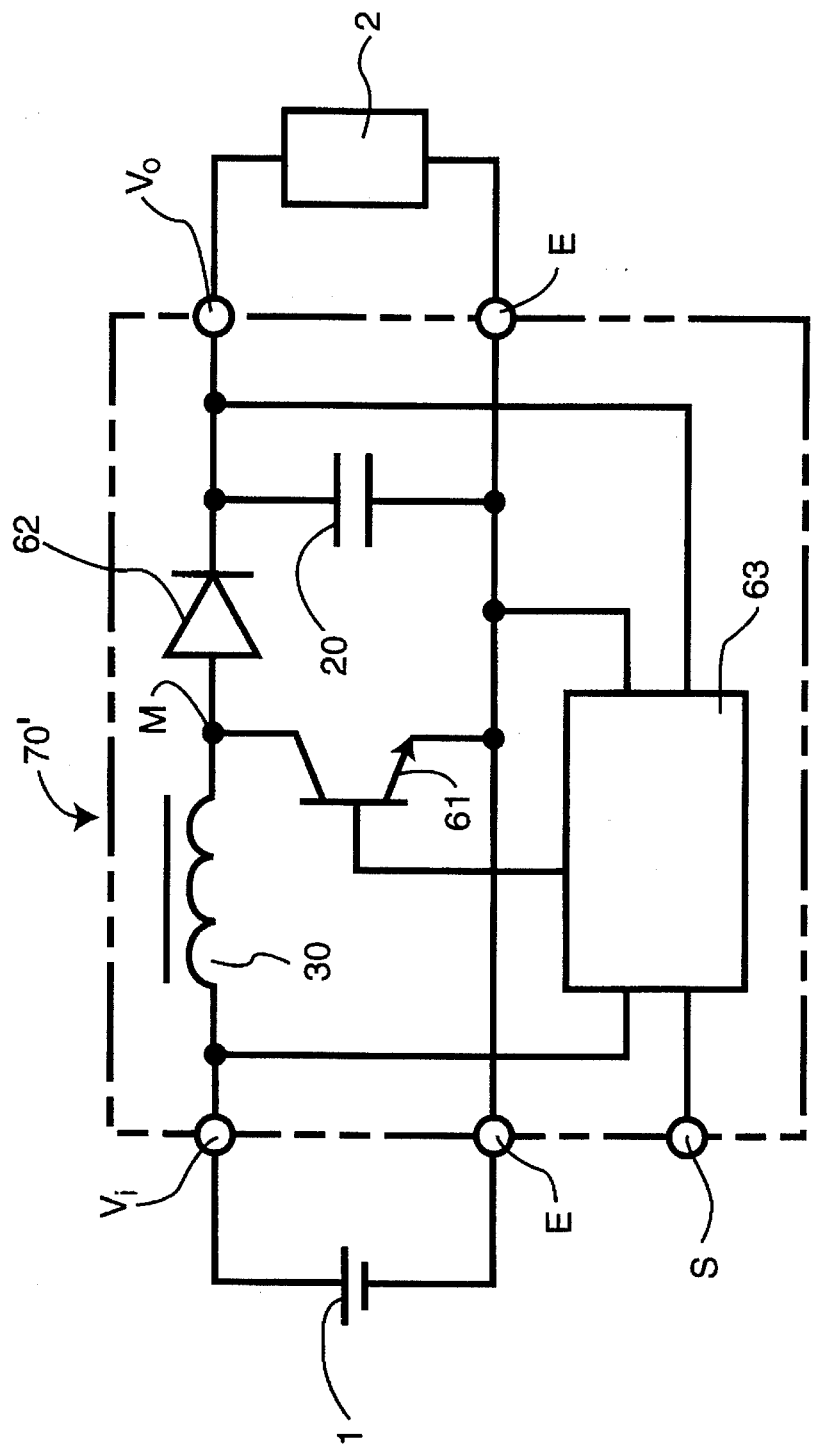
FIG. 5a is a circuit diagram of a stabilized power supply device according to the another embodiment of the present invention.
Figure 5B:
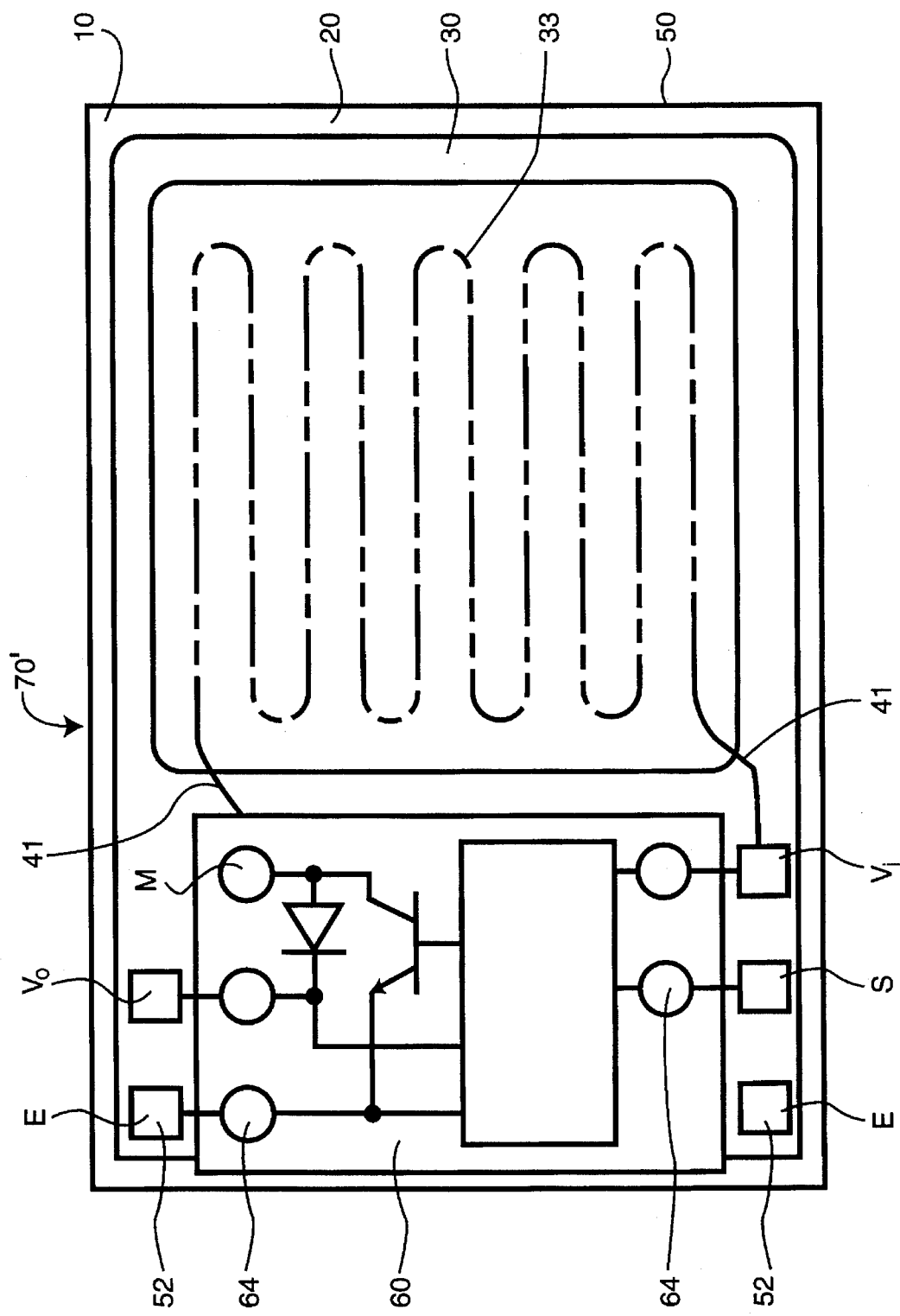

A stabilized power supply device 70' of another embodiment of the present invention is shown in FIGS. 5a–5b. In this embodiment, stabilized power supply device 70' is of a step-up type switching power supply. Its circuit diagram is shown in FIG. 5a. A current, flowing through a magnetic inductive film element 30 as a reactance, receiving an input voltage $V_i$, is switched at a high frequency by a transistor 61. When the current is switched off, an induced pulsating voltage in a magnetic inductive film element 30 is rectified through a diode 62 to a DC voltage. The DC voltage is stabilized with a charge storage film element 20 and supplied to a load as a higher output voltage $V_o$ than the input voltage $V_i$. A control circuit 63 controls a duty ratio of ON/OFF of a transistor 61 to keep output voltage $V_o$ constant as in the preceding embodiment.

FIG. 5b shows a plan view of stabilized power supply device 70'. A charge storage film element 20 is mounted on almost the entire surface of a substrate 10 in the same way as in the preceding embodiment, but a conductor film 33 of magnetic inductive film element 30 is formed into a coil of zigzag shape.

A plurality of bump electrodes 64 of a flip chip of active part 60, shown rather small for the sake of convenience of illustration, are respectively connected to corresponding terminals on an upper surface of passive part laminate 50 thereunder. Both ends of conductor film 33 of magnetic inductive film element 30 are connected through a wiring film 41 to a terminal 52 for input voltage $V_i$ and a terminal underside a bump electrode 64 designated by a symbol M.

As described above, charge storage film element 20 and magnetic inductive film element 30 are also overlapped one by one on substrate 10, and then thin passive part laminate 50 is constructed in this embodiment. Magnetic inductive film element 30 is similarly of a core type but its coil is formed into a zigzag shape which facilitates the inner wiring of passive part laminate 50 as shown in the figure. Furthermore, outside connection terminals 52 of passive part laminate 50 in FIG. 5b are assigned marks corresponding to the circuit diagram in FIG. 5a.

In a stabilized power supply device according to the invention described above, a charge storage film element and a magnetic inductive film element of a passive part both have a structure of a thin film laminate and both are formed into a single flat board shape by being overlapped over each other on a substrate and disposing terminals on the upper surface. The completed device includes bump terminals of the active part, which are built in a flip chip including semiconductors and connected to the terminals on the upper surface of the passive part laminate. Indeed, the device is considered completed upon integration of the active part and passive part laminate into the device. The complete device is characterized as having the following features:

(a) The device is very small. The downsizing is partly due to the positioning of the charge storage film element and the magnetic inductive film element, which overlap when placed upon the substrate. Also, the active part is disposed on the passive part laminate. By effectively utilizing the positioning of all the various components, one forms a very small stabilized power supply device. Also, note that the thin passive part laminate, which includes a thin film laminate, contributes to the downsizing of the device in general. In addition, since the passive part laminate is of a thin film laminate, the device is compressed into a thickness of about 2 mm or less. This in turn provides for a thin flat board shaped device which can be used on a large scale.

(b) Since the patterns of the charge storage film element and the magnetic inductive film element are miniaturized and formed into thin films by utilizing semiconductor technology, the elements can have comparably large capacitance and inductance in spite of their small areas.

(c) The operating frequency of the circuits can also be increased to higher than 1 MHZ based upon the use of the thin film, which improves the overall high frequency performance of the elements.

(d) The work required to attach and connect the various parts of the device is substantially reduced, since the passive part laminate is arranged by a semiconductor process. This feature in turn greatly reduces manufacturing costs and makes the device more competitive in the marketplace.

Similarly, since the active part is formed into a flip chip, which can be simultaneously connected and affixed through the bump electrodes to the passive part laminate, the process for integrating the active part to the passive part laminate takes less time than other methods, which in turn also reduces the overall cost of manufacturing the device of the invention.

The use of a conventional semiconductor substrate as the substrate of a laminate in the present invention is advantageous because it enables one to utilize existing semiconductor technology processes and existing manufacturing equipment. Also, the process and use of a ferroelectric in the dielectric film of the charge storage film element is preferred because it allows for a substantial increase in the capacitance value while simultaneously providing a thin film, which facilitates the overall downsizing of the end product, that is, the device of the invention.

Similarly, the construction of the magnetic inductive film element into a shell type shape according to the invention, wherein the coil of the conductor film is sandwiched between the magnetic films, is preferred, because this increases the inductance value and simplifies the manufacturing process including the flattening process.

Also, the step of overlapping the magnetic inductive film element on the charge storage film element has the advantage of substantially increasing the capacitance, stabilizing an output voltage of the device, and improving the configuration of the passive part laminate.

The method for making the stabilized power supply device of the invention also has advantages not realized by the prior art. For example, the method embraces layering on a substrate, an electrode films and a dielectric film of a charge storage film element, layering magnetic films of a magnetic inductive film element together with growing a coil pattern in a conductive film. Thereafter, the parts are connected to the charge storage film element between the magnetic films by an electroplating method.

Then, a wiring layer is disposed on the magnetic inductive film element, and after forming the terminals from the wiring film, the thin passive part laminate is manufactured.

In addition to the advantages mentioned above, pertaining to the stabilized power supply device of the invention, the aforementioned device manufactured by the method described above exhibits an increased output capacity. This increase in output capacity can be traced to the fine pattern of the coil of the magnetic inductive film element which increases the inductance value together with the thickness of the conductor film which increases the current capacity.

These features, in turn, impart an increased output capacity to the stabilized power supply device of the invention.

Moreover, the flattening process for flattening the upper surface of a laminate also has advantages not realized by the prior art. It is noted that the process includes coating the surface with a liquid insulator of silanol group and/or polyamide resin group followed by solidifying the same. This step substantially strengthens the construction of the layered body in addition to perfectly flattening the surface of the passive part laminate.

Also, the use of solder as the metal for the bump electrodes of the flip chip of the active part has the advantage of preventing the passive part laminate from deterioration at temperatures lower than 300° C. The solder also reduces the time required to connect the bump electrodes to the terminals of the passive part laminate.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A stabilized power supply device, comprising:

a substrate;

a passive part laminate layered on said substrate and having a single flat board shape;

said passive part laminate including a thin charge storage film element;

a thin magnetic inductive film element laminated on said thin charge storage film element;

an active part incorporated in a flip chip including semiconductors and bump electrodes;

a plurality of terminals disposed on an upper surface of said passive part laminate for connecting said passive part laminate to said bump electrodes; and said plurality of terminals being effective for affixing said active part to said passive part laminate.

2. The stabilized power supply device according to claim 1, wherein said substrate is a semiconductor substrate.

3. The stabilized power supply device according to claim 1, wherein said charge storage film element comprises a ferroelectric dielectric film.

4. The stabilized power supply device according to claim 1, wherein said magnetic inductive film element comprises:

upper and lower magnetic films;

a conductor film; and a shell type structure having a coil formed from said conductor film sandwiched between said upper and lower magnetic films.

5. The stabilized power supply device according to claim 1, wherein said magnetic inductive film element overlaps said charge storage film element.

6. The stabilized power supply device according to claim 4, further comprising:

a wiring layer including a wiring film disposed on said upper surface of said passive part laminate;

said wiring film being other than a conductor of said coil of said magnetic inductive film element, and said terminals being formed from said wiring film.

* * * * *